United States Patent
Min

(10) Patent No.: US 11,347,582 B2
(45) Date of Patent: May 31, 2022

(54) METHOD AND APPARATUS FOR SELF-DIAGNOSIS OF RAM ERROR DETECTION LOGIC OF POWERTRAIN CONTROLLER

(71) Applicant: HYUNDAI AUTOEVER CORP., Seoul (KR)

(72) Inventor: Byung-Jin Min, Seoul (KR)

(73) Assignee: HYUNDAI AUTOEVER CORP., Seoul (KR)

( * ) Notice: Subject to any disclaimer, the term of this patent is extended or adjusted under 35 U.S.C. 154(b) by 55 days.

(21) Appl. No.: 16/691,003

(22) Filed: Nov. 21, 2019

(65) Prior Publication Data

US 2020/0167230 A1 May 28, 2020

(30) Foreign Application Priority Data

Nov. 26, 2018 (KR) ........................ 10-2018-0147439

(51) Int. Cl.
| | | |
|---|---|---|
| *G06F 11/10* | (2006.01) | |
| *G06F 11/07* | (2006.01) | |
| *G11C 29/42* | (2006.01) | |
| *G06F 11/30* | (2006.01) | |
| *G06F 11/16* | (2006.01) | |

(52) U.S. Cl.
CPC ...... *G06F 11/1044* (2013.01); *G06F 11/0724* (2013.01); *G06F 11/0772* (2013.01); *G06F 11/102* (2013.01); *G06F 11/1658* (2013.01); *G06F 11/3013* (2013.01); *G06F 11/3037* (2013.01); *G11C 29/42* (2013.01)

(58) Field of Classification Search
CPC ............. G06F 11/1044; G06F 11/0772; G06F 11/102; G06F 11/0724; G06F 11/3037; G06F 11/3013; G06F 11/1658; G06F 11/2215; G06F 11/1048; G06F 11/2205; G06F 11/1004; G06F 11/26; G11C 29/42; G11C 29/02
USPC ......................................................... 714/764
See application file for complete search history.

(56) References Cited

U.S. PATENT DOCUMENTS

| | | | | |
|---|---|---|---|---|
| 6,988,237 B1 * | 1/2006 | Solt | ...................... | G06F 11/2215 714/763 |
| 7,225,375 B2 * | 5/2007 | Cochran | ................ | G11C 29/14 714/733 |

(Continued)

FOREIGN PATENT DOCUMENTS

| | | |
|---|---|---|
| JP | 2016-170787 A | 9/2016 |
| JP | 2018-076072 A | 5/2018 |

(Continued)

OTHER PUBLICATIONS

Korean Notice of Allowance for Korean Application No. 10-2018-0147439 (5 pgs).

*Primary Examiner* — James C Kerveros
(74) *Attorney, Agent, or Firm* — Lempia Summerfield Katz LLC

(57) ABSTRACT

A method for the self-diagnosis of RAM error detection logic of a powertrain controller includes: idling, by a first core, an operation of a second core; testing an error correction code (ECC) module corresponding to a RAM operating by the second core; idling, by the second core, an operation of a core of a plurality of untested cores; and testing an ECC module corresponding to a RAM operating by the core of the plurality of untested cores.

17 Claims, 3 Drawing Sheets

(56) References Cited

U.S. PATENT DOCUMENTS

| | | | |
|---|---|---|---|
| 9,583,216 B2* | 2/2017 | Jones | G11C 29/36 |
| 9,865,362 B1* | 1/2018 | Arora | G11C 29/42 |
| 10,706,950 B1* | 7/2020 | Gallagher | G11C 29/4401 |
| 2014/0143619 A1* | 5/2014 | Gorman | G11B 20/182 |
| | | | 714/719 |
| 2016/0268007 A1* | 9/2016 | Jones | G11C 29/42 |
| 2019/0227121 A1* | 7/2019 | Azam | G06F 11/073 |

FOREIGN PATENT DOCUMENTS

| | | |
|---|---|---|
| KR | 10-2003-0092094 A | 12/2003 |
| KR | 10-2015-0073717 | 7/2015 |
| KR | 10-2016-0076270 A | 6/2016 |

* cited by examiner

METHOD AND APPARATUS FOR SELF-DIAGNOSIS OF RAM ERROR DETECTION LOGIC OF POWERTRAIN CONTROLLER

CROSS-REFERENCE TO RELATED APPLICATION

The present application claims priority to and the benefit of Korean Patent Application No. 10-2018-0147439, filed on Nov. 26, 2018 the entire contents of which are incorporated herein by reference in its entirety.

TECHNICAL FIELD

The present disclosure relates to a method and apparatus for the self-diagnosis of random access memory (RAM) error detection logic of a powertrain controller, and more particularly, to a method and apparatus for the self-diagnosis of RAM error detection logic of a powertrain controller, which can diagnose whether an error occurs in the RAM error detection logic (or error correction code (ECC) module) of a powertrain controller (or powertrain ECU system)

BACKGROUND

The statements in this section merely provide background information related to the present disclosure and may not constitute prior art.

Recently the function safety of a vehicle becomes important as the vehicle is electronically controlled.

Particularly, the memory error detection (or sensing) function of a microcontroller unit (MCU) in which input, calculation and output are performed corresponds to a very important function in preventing a control malfunction.

Accordingly, in a conventional technology, in order to detect an error in a memory (i.e., RAM), when the MCU enables an error correction code (ECC) module, the ECC module operates in such a way to detect an error in the memory (i.e., RAM).

In other words, in a conventional technology, the self-diagnosis of the ECC module (or RAM error detection logic) is impossible, and the type of error occurring in a memory (i.e., RAM) test cannot be distinguished. That is, whether an error occurs in a memory can be known based on only information of the ECC module (or RAM error detection logic).

Accordingly, there is no problem when the ECC module (or RAM error detection logic) operates normally, but there is a problem in that whether the ECC module itself performs a false operation cannot be detected. Accordingly, there is a need for a method capable of verifying whether an error occurs in the ECC module.

SUMMARY

In one form of the present disclosure, a method for the self-diagnosis of RAM error detection logic of a powertrain controller includes, for a self-diagnosis of RAM error detection logic of a powertrain controller to which a multi-core type microcontroller unit (MCU) has been applied, idling, by a first core of the multi-core, an operation of a second core and performing a test on an error correction code (ECC) module corresponding to a RAM operating in conjunction with the second core, and idling, by the second core, an operation of one core, among cores on which a test has not yet been performed, and performing a test on an ECC module corresponding to a RAM operating in conjunction with a corresponding core.

In one form of the present disclosure, the method further includes idling, by an N-th core of the multi-core, an operation of one core, among the cores on which a test has not yet been performed, and performing a test on an ECC module corresponding to a RAM operating in conjunction with a corresponding core, when a test on the N-th core is completed.

In one form of the present disclosure, the test is a test on an ECC module for detecting an error of a designated specific RAM.

In one form of the present disclosure, the method further includes performing initialization for the test. The initialization includes a configuration for preventing a test operation in a test mode for performing the test from affecting powertrain control of the MCU and a configuration for the idling of a core and an ECC module for configuring a test environment in a multi-core system.

In one form of the present disclosure, when the test is performed, each core for performing the test is incapable of performing a test on an ECC module corresponding to a RAM operating in conjunction with each corresponding core and performs a test on an ECC module corresponding to a RAM operating in conjunction with another core.

In one form of the present disclosure, each core for performing the test first idles an operation of a corresponding core operating in conjunction with a RAM on which the test is to be performed by each corresponding core before performing the test, and runs the corresponding core again when the test is completed.

In one form of the present disclosure, when the test on each ECC module is performed, the test performed by each core includes checking whether an error detection function properly operates through a task 1 for performing an OR input on a designated value so that an error occurs in a test bit input port of an ECC comparator, checking whether an error detection function properly operates through a task 2 for a correctable error test in which one bit of input data actually input through the input port of the ECC comparator is flipped and input, and checking whether an error detection function properly operates through a task 3 for an uncorrectable error test in which two bits of input data actually input through the input port of the ECC comparator are flipped and input.

In one form of the present disclosure, the method further includes setting each pre-designated flag to 1 when the test on the ECC module by the core is completed in the test on the ECC module.

In one form of the present disclosure, the method further includes outputting a test result when all tests on ECC modules corresponding to RAMs operating in conjunction with the cores of the multi-core are completed, and releasing initialization configured for the test.

In one form of the present disclosure, the RAM error detection logic is an ECC module.

In another form of the present disclosure, an apparatus for the self-diagnosis of random access memory (RAM) error detection logic of a powertrain controller includes a powertrain controller including an error correction code (ECC) module which is RAM error detection logic, wherein a multi-core type microcontroller unit (MCU) has been applied to the powertrain controller, a controller configured to perform a test on an ECC module corresponding to a RAM operating in conjunction with each of cores of the multi-core, and a memory configured to store a program or algorithm for the self-diagnosis of the RAM error detection logic.

In some forms of the present disclosure, the controller is any one of the cores of the multi-core of the microcontroller unit (MCU).

In some forms of the present disclosure, a first core of the multi-core, as the controller, idles an operation of a second core and performs a test on an ECC module corresponding to a RAM operating in conjunction with the second core. The second core, as the controller, idles an operation of one core, among cores on which a test has not yet been performed, and performs a test on an ECC module corresponding to a RAM operating in conjunction with a corresponding core.

In some forms of the present disclosure, when a test on an N-th core of the multi-core is completed, the N-th core, as the controller, idles an operation of one core, among the cores on which a test has not yet been performed, and performs a test on an ECC module corresponding to a RAM operating in conjunction with a corresponding core.

In some forms of the present disclosure, the test is a test on an ECC module for detecting an error of a specific RAM designated in each of the cores of the multi-core.

In some forms of the present disclosure, each core for performing the test as the controller first idles a corresponding core operating in conjunction with a RAM on which the test is to be performed by each corresponding core before performing the test, and runs the corresponding core again when the test is completed.

In some forms of the present disclosure, when performing the test on each ECC module, each core for performing the test as the controller checks whether an error detection function properly operates through a task 1 for performing an OR input on a designated value so that an error occurs in a test bit input port of an ECC comparator, checks whether an error detection function properly operates through a task 2 for a correctable error test in which one bit of input data actually input through the input port of the ECC comparator is flipped and input, and checks whether an error detection function properly operates through a task 3 for an uncorrectable error test in which two bits of input data actually input through the input port of the ECC comparator are flipped and input.

In some forms of the present disclosure, when performing the test on the ECC module, each core for performing the test as the controller sets each pre-designated flag to 1 when each test on each ECC module by each core is completed.

In some forms of the present disclosure, each core for performing the test as the controller outputs a test result when all tests on ECC modules corresponding to RAMs operating in conjunction with the cores of the multi-core are completed, and releases initialization configured for the test.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
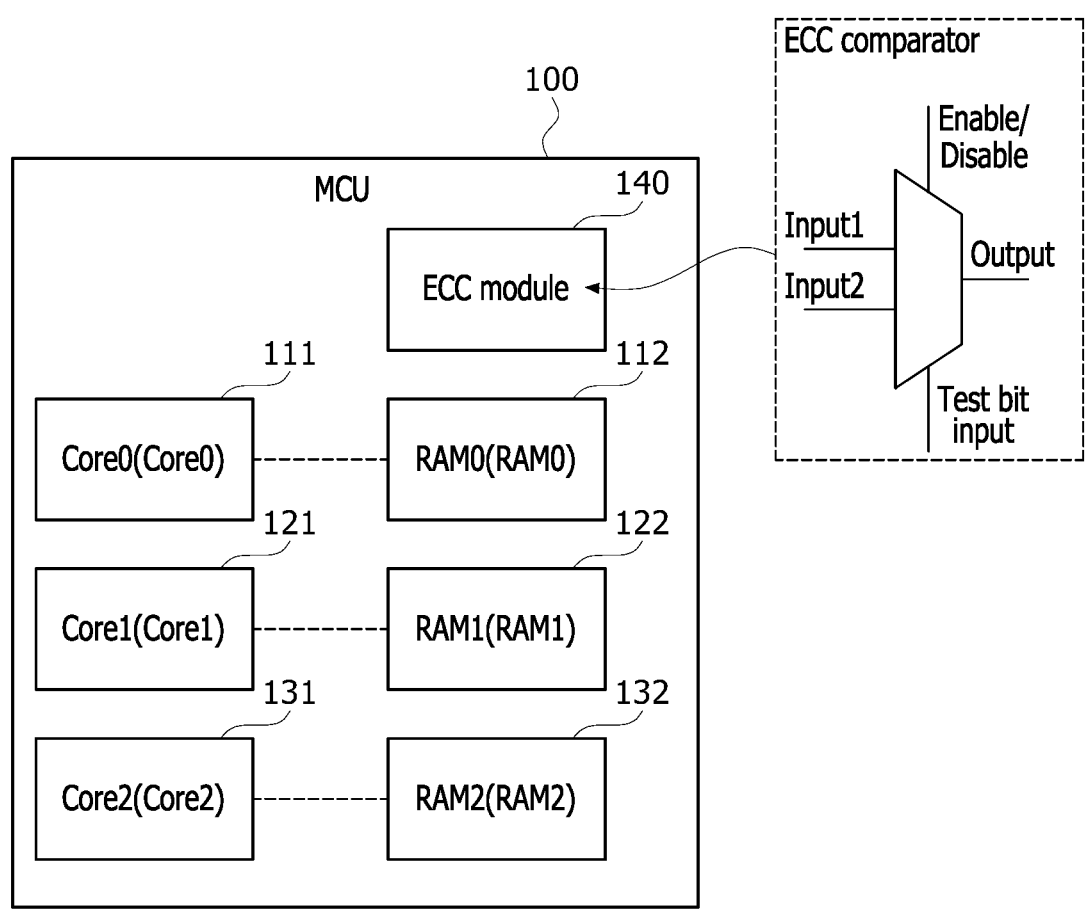
FIG. 1 is an exemplary diagram illustrating a schematic configuration of an apparatus for the self-diagnosis of RAM error detection logic of a powertrain controller in one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

As is traditional in the corresponding field, some forms of the present disclosure may be illustrated in the drawings in terms of functional blocks, units, and/or modules. Those of ordinary skill in the art will appreciate that these block, units, and/or modules are physically implemented by electronic (or optical) circuits such as logic circuits, discrete components, processors, hard-wired circuits, memory elements, wiring connections, and the like. When the blocks, units, and/or modules are implemented by processors or similar hardware, they may be programmed and controlled using software (e.g., code) to perform various functions discussed herein. Alternatively, each block, unit, and/or module may be implemented by dedicated hardware or as a combination of dedicated hardware to perform some functions and a processor (e.g., one or more programmed processors and associated circuitry) to perform other functions. Each block, unit, and/or module in some forms of the present disclosure may be physically separated into two or more interacting and discrete blocks, units, and/or modules without departing from the scope of the inventive concept. Further, blocks, units, and/or module in some forms of the present disclosure may be physically combined into more complex blocks, units, and/or modules without departing from the scope of the inventive concept.

Hereinafter, a method and apparatus for the self-diagnosis of RAM error detection logic of a powertrain controller will be described below with reference to the accompanying drawings in some forms of the present disclosure.

In such a process, the thickness of lines or the size of elements shown in the drawings may have been exaggerated for the clarity of a description and for convenience' sake. Terms to be described below have been defined by taking into consideration their functions in the present disclosure, and may be different depending on an operator's intention or practice. Accordingly, such terms should be interpreted based on the overall contents of this specification.

FIG. 1 is an exemplary diagram illustrating a schematic configuration of an apparatus for the self-diagnosis of RAM error detection logic of a powertrain controller in some forms of the present disclosure.

As illustrated in FIG. 1, in the apparatus for the self-diagnosis of RAM error detection logic of a powertrain controller in some forms of the present disclosure, a microcontroller unit (MCU) 100 used as a powertrain controller includes a plurality of cores 111, 121 and 131 (e.g., Core0, Core1, and Core2), memories 112, 122 and 132 (e.g., RAM0, RAM1, RAM2) operating in conjunction with the plurality of cores 111, 121 and 131, respectively, and an error correction code (ECC) module 140.

Furthermore, although not illustrated in the drawing, the apparatus for the self-diagnosis of RAM error detection logic of a powertrain controller in some forms of the present disclosure includes a memory (not illustrated) for storing a program (or algorithm) for the self-diagnosis of RAM error detection logic.

Furthermore, although not illustrated in the drawing, the apparatus for the self-diagnosis of RAM error detection logic of a powertrain controller in some forms of the present disclosure includes a controller (not illustrated) for collectively performing the self-diagnosis of RAM error detection logic based on a program (or algorithm) for the self-diagnosis of the RAM error detection logic stored in the memory (not illustrated).

In this case, the controller (or test handler) (not illustrated) may include any one of the plurality of cores 111, 121 and 131 (e.g., Core0, Core1, and Core2) or another core (not illustrated) of the MCU 100.

The ECC module 140 includes at least one ECC comparator therein. In some forms of the present disclosure, the controller (not illustrated) selects a test mode or a powertrain control mode based on a program (or algorithm) for the self-diagnosis of RAM error detection logic (i.e., ECC module) stored in the memory (not illustrated). Accordingly, a test operation in the test mode does not affect powertrain control.

For reference, in a multi-core system, a memory (or RAM) test (i.e., a test on an ECC module for detecting an error of a specific RAM) needs to be performed in the state in which a core operating in conjunction with a corresponding RAM has been stopped (or idled).

Accordingly, for the RAM test (i.e., a test on an ECC module for detecting an error of a specific RAM), when the test is completed after the controller stops (or idles) the corresponding core (e.g., one of Core0 to Core2) operating in conjunction with a corresponding RAM, the controller (or test handler) (not illustrated) runs the stopped (or idled) core (e.g., one of Core0 to Core2) again.

Figure 3:
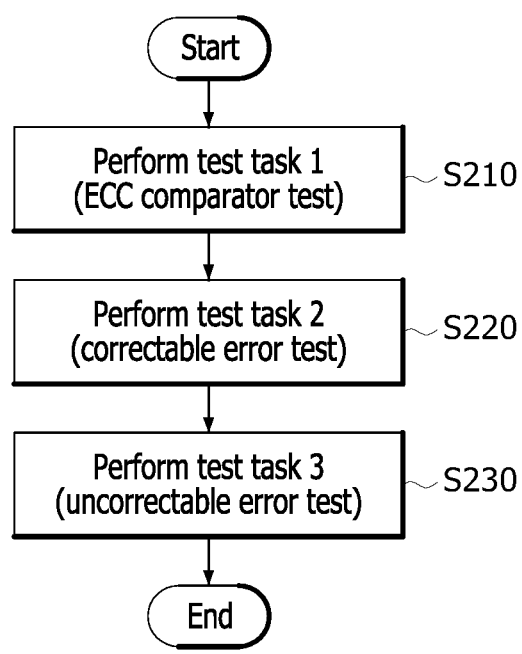
FIG. 3 is a flowchart for describing three types of test tasks for a RAM test in FIG. 2.

In this case, in some forms of the present disclosure, the RAM test (i.e., a test on an ECC module for detecting an error of a specific RAM) includes basically performing three types of test tasks (refer to FIG. 3). That is, the three types of test tasks are basically performed on RAM error detection logic (i.e., ECC module) for detecting an error of a RAM corresponding to any one of the plurality of memories (e.g., RAM0 to RAM2) included in the MCU (refer to FIG. 3).

The three types of test tasks for a RAM test (i.e., a test on an ECC module for detecting an error of a specific RAM) will be described more specifically with reference to FIG. 3.

In some forms of the present disclosure, a method for the self-diagnosis of RAM error detection logic in a multi-core system having three cores has been illustrated, but the method may also be applied to a multi-core system having four or more cores.

Figure 2:
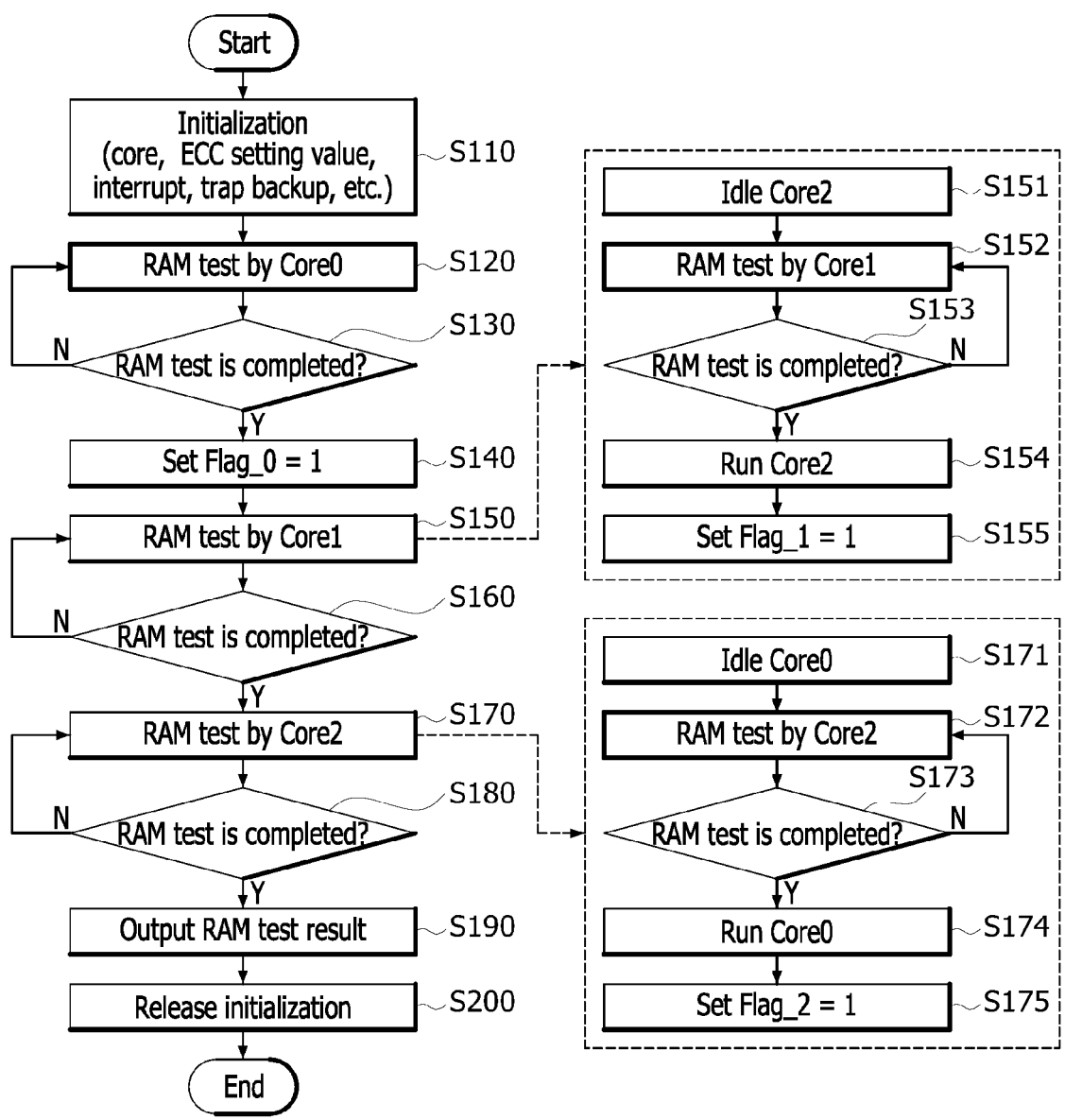
FIG. 2 is a flowchart for describing a method for the self-diagnosis of the RAM error detection logic of a powertrain controller in one form of the present disclosure.

FIG. 2 is a flowchart for describing a method for the self-diagnosis of the RAM error detection logic of a powertrain controller in some forms of the present disclosure. FIG. 3 is a flowchart for describing three types of test tasks for a RAM test in FIG. 2.

A method for the self-diagnosis of the RAM error detection logic of a powertrain controller in some forms of the present disclosure is described below with reference to FIGS. 2 and 3.

Referring to FIG. 2, when a RAM test mode is started, the controller (not illustrated) performs initialization for a RAM test (i.e., a test on an ECC module for detecting an error of a specific RAM) based on a pre-designated configuration (S110).

For example, the initialization includes a configuration (e.g., interrupt or trap backup) for preventing a test operation in the RAM test mode from affecting powertrain control and a configuration for a core (e.g., core idle) and an ECC module for configuring a test environment in a multi-core system.

When the initialization for the RAM test (i.e., a test on an ECC module for detecting an error of a specific RAM) is completed as described above, a RAM (e.g., RAM1) test by a first core (Core0) 111 of the multi-core is performed (S120).

In this case, the first core (Core0) 111 cannot perform a RAM test on a RAM (i.e., RAM0) operating in conjunction with the first core 111, and may perform a RAM test on a RAM (e.g., RAM1 or RAM2) operating in conjunction with another core (e.g., Core1 or Core2). Furthermore, the first core (Core0) 111 needs to stop (or idle) a corresponding core (e.g., one of Core1 to Core2) operating in conjunction with a RAM on which the RAM test will be performed. The reason for this is that if the corresponding core is not stopped (or idled), the RAM operating in conjunction with the core continues to operate.

A method of performing a RAM (e.g., RAM1) test by the first core (Core0) 111 is performed through the three types of test tasks S210, S220, and S230 illustrated in FIG. 3.

Referring to FIG. 3, the first core (Core0) 111 checks whether an error detection function properly operates through a task 1 for performing an OR input (in this case, all input data input through a test bit input port of the ECC comparator are normal data) on a designated value (e.g., 1) so that an error occurs in the test bit input port (S210).

Furthermore, the first core (Core0) 111 checks whether an error detection function properly operates through a task 2 for a correctable error test in which one bit of input data actually input through the input port of the ECC comparator is flipped and input (S220).

Furthermore, the first core (Core0) 111 checks whether an error detection function properly operates through a task 3 for an uncorrectable error test in which two bits of input data actually input through the input port of the ECC comparator are flipped and input (S230).

The type of error of an ECC module occurring in a RAM test is determined through the test tasks 1, 2 and 3 (S210 to S230).

Referring back to FIG. 2, when the RAM (e.g., RAM1) test by the first core (Core0) 111 is completed (yes (Y) in S130), the first core (Core0) 111 sets a flag0 to 1 (i.e., Set Flag_0=1) (S140). If the flag0 is set to 1 (i.e., Set Flag_0=1), this means that the RAM (e.g., RAM1) test by the first core (Core0) 111 has been completed.

When the RAM (e.g., RAM1) test by the first core (Core0) 111 is completed as described above, a RAM (e.g., RAM2) test by a second core (Core1) 121 is performed (S150).

When the RAM (e.g., RAM2) test by the second core (Core1) 121 is performed, the second core (Core1) 121 stops (or idles) the third core (Core2) 131 operating in conjunction with a RAM (e.g., RAM2), that is, a RAM test target (S151).

Furthermore, the RAM (e.g., RAM2) test by the second core (Core1) 121 is performed (S152). A method of performing the RAM (e.g., RAM2) test by the second core (Core1) 121 is performed through the three types of test tasks S210, S220, and S230 illustrated in FIG. 3. Since the three types of test tasks S210, S220, and S230 illustrated in FIG. 3 are the same as those described above, a description thereof is omitted hereinafter.

Furthermore, when the RAM (e.g., RAM2) test by the second core (Core1) 121 is completed (yes (Y) in S153), the second core (Core1) 121 runs the third core (Core2) 121 again (S154) and sets a flag1 to 1 (i.e., Set Flag_1=1) (S155). If the flag1 is set to 1 (i.e., Set Flag_1=1), this means that the RAM (e.g., RAM2) test by the second core (Core1) 121 has been completed.

When the RAM (e.g., RAM2) test by the second core (Core1) 121 is completed as described above (yes (Y) in S160), a RAM (e.g., RAM0) test by a third core (Core2) 131 is performed (S170).

When the RAM (e.g., RAM0) test by the third core (Core2) 131 is performed, the third core (Core2) 131 stops (or idles) the first core (Core0) 111 operating in conjunction with a RAM (e.g., RAM0), that is, a RAM test target (S171).

Furthermore, the RAM (e.g., RAM0) test by the third core (Core2) 131 is performed (S172). A method of performing the RAM (e.g., RAM0) test by the third core (Core2) 131 is performed through the three types of test tasks S210, S220, and S230 illustrated in FIG. 3. Since the three types of test tasks S210, S220, and S230 illustrated in FIG. 3 are the same as those described above, a description thereof is omitted hereinafter.

Furthermore, when the RAM (e.g., RAM0) test by the third core (Core2) 131 is completed (yes (Y) in S173), the third core (Core2) 131 runs the first core (Core0) 111 again (S174) and sets a flag2 to 1 (i.e., Set Flag_2=1) (S175). If the flag2 is set to 1 (i.e., Set Flag_2=1), this means that the RAM (e.g., RAM0) test by the third core (Core2) 131 has been completed.

When the RAM (e.g., RAM0) test by the third core (Core2) 131 is completed as described above (yes (Y) in S180), that is, when RAM tests on ECC modules corresponding to all the RAMs of the multi-core system are completed, a RAM test result is output (S190). The initialization configured to the RAM tests is released (S200).

As described above, in some forms of the present disclosure, in a multi-core system, a first core stops (or idles) an operation of a next core (i.e., second core) and performs a test on an ECC module corresponding to a RAM operating in conjunction with the core (i.e., second core). The next core (i.e., second core) stops (or idles) an operation of a core after next (i.e., third core), and performs a test on an ECC module corresponding to a RAM operating in conjunction with the core (i.e., third core). The last core (i.e., N-th core) stops (or idles) an operation of the first core, and performs a test on an ECC module corresponding to a RAM operating in conjunction with the core (i.e., first core).

In some forms of the present disclosure, each of the cores of a multi-core has been illustrated as if it performs a test on a RAM operating in conjunction with another core based on only a designated sequence. However, a RAM test is not performed by assigning order to a core. It is to be noted that any one core that belongs to a multi-core and on which a test has been completed may perform tests on ECC modules corresponding to RAMs operating in conjunction with all other (or a plurality of) cores except the corresponding core.

As described above, in some forms of the present disclosure, whether an error occurs in the RAM error detection logic (or ECC module) of a powertrain controller (or powertrain ECU system) can be checked.

The present disclosure has been described above based on some forms illustrated in the accompanying drawings, but the forms are merely illustrative. A person having ordinary skill in the art to which the present disclosure pertains will understand that various modifications and other equivalent forms are possible. Accordingly, the technical range of protection of the present disclosure should be determined by the following claims. Furthermore, an implementation described in this specification may be realized as a method or process, apparatus, software program, data stream or signal, for example. Although the disclosure has been discussed only in the context of a single form of an implementation (e.g., discussed as only a method), an implementation having a discussed characteristic may also be realized in another form (e.g., apparatus or program). The apparatus may be implemented as proper hardware, software or firmware. The method may be implemented in an apparatus, such as a processor commonly referring to a processing device, including a computer, a microprocessor, an integrated circuit or a programmable logic device, for example. The processor includes a communication device, such as a computer, a cell phone, a mobile phone/personal digital assistant ("PDA") and another device which facilitates the communication of information between end-users.

According to an aspect of the present disclosure, the present disclosure can diagnose whether an error occurs in the RAM error detection logic (or ECC module) of a powertrain controller (or powertrain ECU system).

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for a self-diagnosis of random access memory (RAM) error detection logic of a powertrain controller comprising a plurality of cores, the method comprising:

idling, by a first core of the plurality of cores, an operation of a second core of the plurality of cores;

testing, by the first core, an error correction code (ECC) module corresponding to a RAM configured to operate with the second core, wherein the ECC module is configured to test the RAM configured to operate with the second core;

idling, by the second core, an operation of a remaining core of the plurality of cores;

testing, by the second core, the ECC module corresponding to a RAM configured to operate with the remaining core of the plurality of cores, wherein the ECC module is further configured to test the RAM configured to operate with the remaining core of the plurality of cores;

determining whether an error occurs in a test bit input port of an ECC comparator of the ECC module or in an input port of the ECC comparator of the ECC module;

in response to determining that the error occurs in the test bit input port of the ECC comparator of the ECC module, checking whether the error in the test bit input port of the ECC comparator of the ECC module occurs due to an OR input on a predetermined value; and in response to determining that the error occurs in the input port of the ECC comparator of the ECC module, checking whether the error in the input port of the ECC comparator of the ECC module occurs due to one flipped bit of input data that is input through the input port or due to two flipped bits of input data that is input through the input port.

2. The method of claim 1, wherein the method further comprises:

when a test on an N-th core of a plurality of cores is completed, idling, by the N-th core, an operation of the core of the plurality of untested cores; and testing an ECC module corresponding to a RAM operating by the core of the plurality of untested cores.

3. The method of claim 1, wherein the testing the ECC module comprises:

testing the ECC module to detect an error of a designated RAM.

4. The method of claim 1, wherein the method further comprises:

initializing the test, wherein the initializing the test further comprises:
preventing a test operation in a test mode such that powertrain control of a multi-core type microcontroller unit (MC) is unaffected; and
idling a core of a plurality of cores and the ECC module to provide a test environment in a multi-core system.

5. The method of claim 1, wherein the testing the ECC module comprises:

not testing the ECC module corresponding to a RAM operating by a core of a plurality of cores; and
testing the ECC module corresponding to a RAM operating by another core of the plurality of cores.

6. The method of claim 5, wherein the method comprises:

idling an operation of the core of the plurality of cores operating in conjunction with a RAM on which the test is to be performed by each core of the plurality of cores before performing the test; and
running the core of the plurality of cores again when the test is completed.

7. The method of claim 1, wherein the method further comprises:

setting each pre-designated flag to 1 when testing the ECC module by the core is completed.

8. The method of claim 1, wherein the method further comprises:

outputting a test result when all tests on the ECC module corresponding to RAM operating by the core of the plurality of cores are completed; and
initializing the test.

9. The method of claim 1, wherein the ECC module is a RAM error detection logic.

10. An apparatus for self-diagnosing a random access memory (RAM) error detection logic of a powertrain controller, the apparatus comprising:

a powertrain controller comprising an error correction code (ECC) module which is RAM error detection logic, wherein a multi-core type microcontroller unit (MCU) comprising a plurality of cores has been applied to the powertrain controller;
a controller configured to test an ECC module corresponding to a RAM configured to operate with each core of the plurality of cores, wherein the ECC module is configured to test the RAM configured to operate with the core of the plurality cores;
a memory configured to store a program or algorithm for self-diagnosing the RAM error detection logic; and
the plurality of cores configured to:
determine whether an error occurs in a test bit input port of an ECC comparator of the ECC module or in an input port of the ECC comparator of the ECC module;
when it is determined that the error occurs in the test bit input port of the ECC comparator of the ECC module, check whether the error in the test bit input port of the ECC comparator of the ECC module occurs due to an OR input on a predetermined value; and
when it is determined that the error occurs in the input port of the ECC comparator of the ECC module, check whether the error in the input port of the ECC comparator of the ECC module occurs due to one bit of input data that is input through the input port or due to two flipped bits of input data that is input through the input port.

11. The apparatus of claim 10, wherein the controller is a core of the plurality of cores of the MCU.

12. The apparatus of claim 10, wherein:

a first core of the plurality of cores is configured to:
idle an operation of a second core of the plurality of cores; and
test an ECC module corresponding to a RAM operating by the second core of the plurality of cores; and
the second core of the plurality of cores is configured to:
idle an operation of a core of a plurality of untested cores; and
test an ECC module corresponding to a RAM operating by the core of the plurality of untested cores.

13. The apparatus of claim 10, wherein when a test on an N-th core of the plurality of cores is completed, the N-th core is configured to:

idle an operation of a core of a plurality of untested cores; and
test an ECC module corresponding to a RAM operating by the core of the plurality of untested cores.

14. The apparatus of claim 10, wherein the controller is configured to:

detect an error of a designated RAM in each core of the plurality of cores.

15. The apparatus of claim 10, wherein each core of the plurality of cores is configured to:

idle the core of the plurality of cores operating in conjunction with a RAM on which the test is to be performed by each core of the plurality of cores before the test; and
run the core of the plurality of cores again when the test is completed.

16. The apparatus of claim 10, wherein each core of the plurality of cores is configured to set each pre-designated flag to 1 when testing the ECC module by each core of the plurality of cores is completed.

17. The apparatus of claim 10, wherein each core of the plurality of cores is configured to:

output a test result when all tests on ECC modules corresponding to RAM operating by the core of the plurality of cores are completed; and
initialize the test.

* * * * *